(12) United States Patent
Hilgers et al.

(10) Patent No.: US 11,276,811 B2
(45) Date of Patent: Mar. 15, 2022

(54) ACTUATOR AND SENSOR DEVICE BASED ON ELECTROACTIVE POLYMER

(71) Applicant: KONINKLIJKE PHILIPS N.V., Eindhoven (NL)

(72) Inventors: Achim Hilgers, Alsdorf (DE); Daan Anton Van Den Ende, Breda (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 375 days.

(21) Appl. No.: 16/485,567

(22) PCT Filed: Feb. 11, 2018

(86) PCT No.: PCT/EP2018/053370
§ 371 (c)(1),
(2) Date: Aug. 13, 2019

(87) PCT Pub. No.: WO2018/153705
PCT Pub. Date: Aug. 30, 2018

(65) Prior Publication Data
US 2020/0052184 A1    Feb. 13, 2020

(30) Foreign Application Priority Data
Feb. 22, 2017  (EP) ..................... 17157440

(51) Int. Cl.
*H01L 41/04* (2006.01)
*H01L 41/09* (2006.01)
(Continued)

(52) U.S. Cl.
CPC ........ *H01L 41/042* (2013.01); *G01R 19/0023* (2013.01); *H01L 41/0471* (2013.01);
(Continued)

(58) Field of Classification Search
CPC ... H01L 41/042; H01L 41/0471; H01L 41/09; H01L 41/1132
See application file for complete search history.

(56) References Cited

U.S. PATENT DOCUMENTS 6,424,076 B1   7/2002  Gullapalli
7,680,373 B2   3/2010  Melville et al.
(Continued)

FOREIGN PATENT DOCUMENTS

RU      2568944 C2     11/2015
WO      2010/095960 A1  8/2010
(Continued)

OTHER PUBLICATIONS

Search Report from PCT/EP2018/053370 dated Apr. 19, 2018.

*Primary Examiner* — Derek J Rosenau
(74) *Attorney, Agent, or Firm* — Schott, P.C.

(57) ABSTRACT

An electroactive material actuator and sensor is actuated with an actuation signal having an activation period for charging the actuator and a de-activation period for discharging the actuator. A parallel resistance of the actuator is determined by sensing a steady state current during the activation period and a series capacitance of the actuator is determined based on a charge flow during charging of the actuator at the beginning of the activation period. A series resistance is obtained by controlling a current through the actuator with an oscillating profile so that a phase relationship of the actuator between current and voltage can be measured. An oscillating current sink is used to enable circuit component measurements, which implement sensing functionality.

17 Claims, 5 Drawing Sheets

(51) Int. Cl.
  *G01R 19/00*   (2006.01)
  *H01L 41/047*  (2006.01)
  *H01L 41/083*  (2006.01)
  *H01L 41/113*  (2006.01)
  *H01L 41/193*  (2006.01)

(52) U.S. Cl.
  CPC ............ *H01L 41/083* (2013.01); *H01L 41/09* (2013.01); *H01L 41/1132* (2013.01); *H01L 41/193* (2013.01)

(56) References Cited

U.S. PATENT DOCUMENTS

| | | |
|---|---|---|
| 7,834,527 B2 | 11/2010 | Alvarez et al. |
| 7,893,965 B2 | 2/2011 | Heim et al. |
| 8,981,682 B2 | 3/2015 | Delson et al. |
| 10,228,396 B2 | 3/2019 | Gisby et al. |
| 2002/0130673 A1 | 9/2002 | Pelrine et al. |
| 2010/0268121 A1 | 10/2010 | Kilborn |
| 2011/0068657 A1* | 3/2011 | Sunaga ................ H01L 41/042 310/316.01 |
| 2012/0086366 A1 | 4/2012 | Anderson et al. |
| 2014/0139239 A1 | 5/2014 | Zachut et al. |
| 2017/0347957 A1 | 12/2017 | Van Den Ende |
| 2018/0103747 A1 | 4/2018 | Lavezzo et al. |

FOREIGN PATENT DOCUMENTS

| | | |
|---|---|---|
| WO | 2010123820 A2 | 10/2010 |
| WO | 2011094882 A1 | 8/2011 |
| WO | 2012032443 A1 | 3/2012 |

* cited by examiner

ACTUATOR AND SENSOR DEVICE BASED ON ELECTROACTIVE POLYMER

CROSS-REFERENCE TO PRIOR APPLICATIONS

This application is the U.S. National Phase application under 35 U.S.C. § 371 of International Application No. PCT/EP2018/053370, filed on Feb. 11, 2018, which claims the benefit of EP Patent Application No. EP 17157440.3, filed on Feb. 22, 2017. These applications are hereby incorporated by reference herein.

FIELD OF THE INVENTION

This invention relates to actuator/sensor devices which make use of electroactive materials for actuation and sensing.

BACKGROUND OF THE INVENTION

Electroactive materials (EAM) are a class of materials within the field of electrically responsive materials. When implemented in an actuation device, subjecting an EAM to an electrical drive signal can make them change in size and/or shape. This effect can be used for actuation and sensing purposes. There exist inorganic and organic EAMs. A special kind of organic EAMs are Electroactive polymers (EAPs).

Electroactive polymers (EAP) are an emerging class of electrically responsive materials. EAPs, like EAMs can work as sensors or actuators, but can be more easily manufactured into various shapes allowing easy integration into a large variety of systems. Other advantages of EAPs include low power, small form factor, flexibility, noiseless operation, and accuracy, the possibility of high resolution, fast response times, and cyclic actuation. An EAP device can be used in any application in which a small amount of movement of a component or feature is desired, based on electric actuation. Similarly, the technology can be used for sensing small movements. The use of EAPs enables functions which were not possible before, or offers a big advantage over common sensor/actuator solutions, due to the combination of a relatively large deformation and force in a small volume or thin form factor, compared to common actuators. EAPs also give noiseless operation, accurate electronic control, fast response, and a large range of possible actuation frequencies, such as 0-20 kHz.

As an example of how an EAM device can be constructed and can operate, FIGS. 1 and 2 show two possible operating modes for an EAP device that comprises an electroactive polymer layer 14 sandwiched between electrodes 10, 12 on opposite sides of the electroactive polymer layer 14. FIG. 1 shows a device which is not clamped to a carrier layer. A voltage is used to cause the electroactive polymer layer to expand in all directions as shown. FIG. 2 shows a device which is designed so that the expansion arises only in one direction. To this end the structure of FIG. 1 is clamped or attached to a carrier layer 16. A voltage is used to cause the electroactive polymer layer to curve or bow. The nature of this movement arises from the interaction between the active layer which expands when actuated, and the passive carrier layer which does not.

For certain classes of EAM, application of a small force (mechanical load) to the device generates an electrical signal in response. This allows a single EAM structure to be used both for actuation and for sensing. This double functionality is beneficial because of not requiring two separate components (for actuation and sensing) and thus saving cost and size. The sensing can for example be used to determine a pressure or force acting on the device or it can be used to control the actuation level in a feedback manner.

The sensing ability of an electroactive material actuator is based on determination of the electrical complex input impedance.

Known EAM based actuator/sensors have typically provided sensing and actuation functions which are separated from one another, either physically, wherein a different region or portion of the device is used for sensing as for actuation, with separately provided electrical connection to each for example, or temporally, wherein the single device is sequentially alternated between a sensing function and an actuation function. For example, US 2014/0139329 discloses an EAP system comprising a sensing circuit, an actuating circuit and a switching circuit. The sensing circuit is adapted to detect a signal from the EAP when it is deformed. Only subsequently does the switching circuit then activate the actuating circuit so that it can generate an actuation based on the sensing input. Hence, sensing and actuation are temporally separated from one another: sensing and actuation occur sequentially, one following on from the other.

More recently, simultaneous sensing and actuation and using the same device has been proposed. By way of example, the applicant has proposed (but not yet published at the priority date of this application) a device capable of actuation and sensing simultaneously. A first control signal is for use in actuation of the device and a second control signal is for use in sensing by the device. The second, sensing, signal is an AC electrical signal selected so that mechanical resonance of the actuator can be determined from that electrical sensing signal. The first, actuation, signal can be any type of control signal as long as it is suitable for causing an actuation.

The actuation signal and sensing signals can be superposed to from a combined control signal. When the sensing signal is applied at a frequency matching the mechanical resonance frequency, or one of its harmonics, of the EAM structure, a mechanical standing wave is established in the structure which in turn affects the electrical characteristics of the structure. In particular, the impedance of the structure is lower for a sensing signal (and thus for that part of control signal) matching the resonance frequency, due to the mechanical vibration being in-phase with the sensing signal. Conversely, the impedance of the material is higher for a sensing signal matching the anti-resonance frequency of the material, due to the mechanical vibration being out of phase with the sensing signal. It appears that at such frequencies sensing is extremely effective while it does not disturb longer term simultaneous actuation.

Any mechanical load, such as for example a pressure, applied to the electroactive material structure may cause a damping in the structure, causing its resonance frequency (and the anti-resonance frequency) to shift away from the ordinary undamped value, thereby inducing a disparity between the high-frequency sensing signal and the fundamental frequency of mechanical vibration (or or the anti-resonant equivalent, in the case of anti-resonance matching). Thus, a shift in resonance frequency can be detected and/or determined and this can then be correlated with the external mechanical load.

US 2002/0130673 also mentions the possibility of achieving combined sensing and actuation in the same active area of a polymer by means of superposing a low amplitude, high frequency AC sensing signal on top of a primary driving (actuation) signal.

If charge sensing is used, a problem arises that highly sensitive charge amplifiers are required which makes it complicate to sense while actuation is required. The use of a high frequency sensing signal requires a separate voltage generator to generate the oscillating signal, supplied to the sensing element. The superposition of the different voltages also requires electrical circuitry. Thus, complex drive circuitry is required.

An additional issue with the use of superposed AC and DC signals is that he high frequency source needs to be protected from the high voltage DC operation voltage and the DC generator needs to be decoupled from the AC source. Bulky and costly DC-biasing solutions may thus be required. Further, the AC modulation may result in small oscillations, which can disturb the activation itself.

There is a need for a device and operating method wherein simultaneous sensing and actuation may be achieved with a simplified sensing circuitry.

SUMMARY OF THE INVENTION

It is an object of the invention to at least partially fulfill the aforementioned need. This object is achieved with the invention as defined with the independent claims. The dependent claims provide advantageous embodiments.

Examples in accordance with a first aspect of the invention provide a device for simultaneous actuation and sensing comprising:

an electroactive material actuator and sensor component, having an equivalent electrical circuit of a first resistor in parallel with the series combination of a capacitor and a second resistor;

an electrode arrangement;

a current sensor for sensing a current flowing to the component;

a current source for controlling a current through the component;

means for determining a voltage at the component;

a controller adapted to provide an actuation signal to the electrode arrangement, which comprises an activation period for charging the component, wherein the controller is further adapted to:

determine a resistance of the first resistor by sensing a steady state current during the activation period;

determine a capacitance of the capacitor by determining a charge flow during charging of the component at the beginning of the activation period, and taking into account the resistance of the first resistor; and determine a resistance of the second resistor by controlling a current through the component using the current source during charging or discharging to have an oscillating profile and determining a phase relationship between the current sensed by the current sensor and a voltage measured by the voltage meter.

This device enables the use of an electroactive material component (such an electroactive polymer (EAP) actuator) as both a sensor element and an actuator, without the requirement of an additional voltage source to generate an oscillating voltage to measure the (change of the) input impedance of the component. By using an oscillating current sink, no bulky and costly dc-biasing blocks and ac-coupling components are required, as the current source may be implemented simply as a controllable transistor circuit. Finally the device may provide sensing with no impact on the actuation level itself.

The actuation signal is preferably a voltage waveform. The means for determining a voltage may comprise a voltage meter for reading a voltage at the component. However, the voltage may instead be known, since it results from the actuation signal, and it may then not require further measurement.

The phase relationship is able to be used to determine the resistance of the second resistor, once the first (parallel) resistor and capacitor values have been determined.

The electroactive material actuator and sensor component may be a field-driven or a current-driven component. The equivalent circuit is basically the same, representing a lossy capacitor.

The actuation signal preferably has an activation period of at least 0.5 seconds. Thus, the device is for relatively slow actuation changes. This enables the device to reach an electrical steady state, so that resistances can be measured without the influence of the capacitance. The activation period may be at least 1.0 seconds.

The oscillation frequency may be much higher relative to the activation period duration, so the discharge time can be much shorter. For example, the discharge current may oscillate at f=1 kHz with 5 cycles needed to provide discharge, giving a discharge time of 5 ms.

There are many applications where a high speed is not necessarily required for actuation such as for catheter applications.

The oscillating profile preferably has a frequency of at least 100 Hz, for example at least 1 kHz. In this way, the oscillating signal may have a short duration, so as to have minimum impact on the actuation. The oscillating signal is the only measurement which does not make use of the normal actuation profile. It may be limited to a small number of cycles only sufficient to determine the phase relationship.

The oscillating profile may have a DC bias for reducing the effect on activation or deactivation of the component. For example, if the oscillating profile is applied during deactivation, it may be desired for the activated state to be retained as much as possible. A DC bias may be used for this purpose, so that only partial mechanical deactivation of the component takes place to enable the phase relationship to be determined.

The oscillating profile may have a frequency which varies over time. This may be used to enable a resonance response to be determined. This resonance will be detected for the overall electrical circuit. The resonance frequency measurement is made as well as the phase angle measurement. The variable frequency current sink may be implemented by a microcontroller controlling the current sink (e.g. transistor or transistor circuit) via digital to analog conversion.

The controller may be adapted to determine the resistance of the second resistor during discharging as mentioned above. However, it may instead be adapted to determine the resistance of the second resistor during charging. For example, part of the actuation signal may comprise a portion without current control (for the steady stage measurements) and part may comprise a portion with current control.

The controller may be further adapted to determine, from the determined resistances and capacitance, an external force, pressure or temperature at the component.

Examples in accordance with another aspect of the invention provide a method for simultaneous actuation and sensing using an electroactive material actuator and sensor component, having an equivalent electrical circuit of a first resistor in parallel with the series combination of a capacitor and a second resistor, the method comprising:

providing an actuation signal to the electrode arrangement, which comprises an activation period for charging the component, determining a resistance of the first resistor by sensing a steady state current during the activation period;

determining a capacitance of the capacitor by determining a charge flow during charging of the component at the beginning of the activation period, and taking into account the resistance of the first resistor;

determining a resistance of the second resistor by controlling a current through the component during charging or discharging to have an oscillating profile and determining a phase relationship between a sensed current and voltage.

This method enables determination of the electrical characteristics of the component in a simple way with no impact on the desired actuation. These characteristics are representative of an external property being sensed (such as temperature, force or pressure).

The method may comprise generating an oscillating profile with a frequency of at least 100 Hz, for example at least 1 kHz. The oscillating profile may have a DC bias for reducing the effect on the activation or deactivation of the component. The oscillating profile may have a frequency which varies over time. Determining the resistance of the second resistor may take place during charging or discharging.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides an electroactive material actuator with sensor functionality, which is actuated with an actuation signal having an activation period for charging the actuator and optionally also a de-activation period for discharging the actuator. A parallel resistance of the actuator is determined by sensing a steady state current during the activation period and a series capacitance of the actuator is determined based on a charge flow during charging of the actuator at the beginning of the activation period. A series resistance is obtained by controlling a current through the actuator with an oscillating profile so that a phase relationship of the actuator between current and voltage can be measured. An oscillating current sink is used to enable circuit component measurements, which implements sensing functionality.

Figure 1:
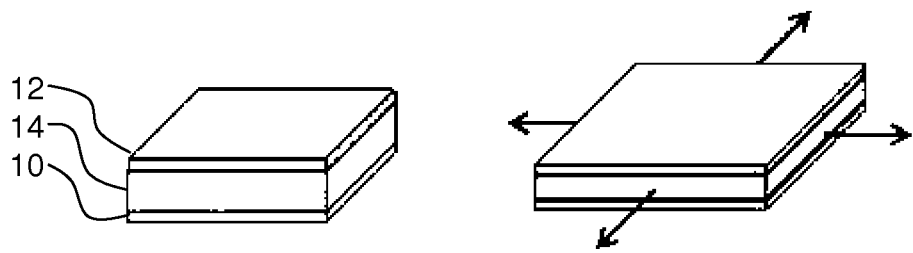
FIG. 1 shows a known electroactive polymer device which is not clamped.
Figure 2:
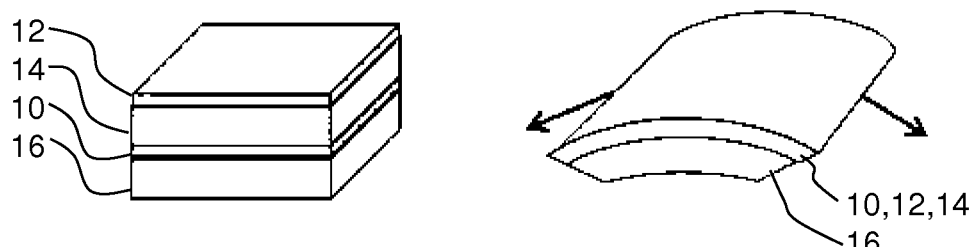
FIG. 2 shows a known electroactive polymer device which is constrained by a backing layer.
Figure 3:
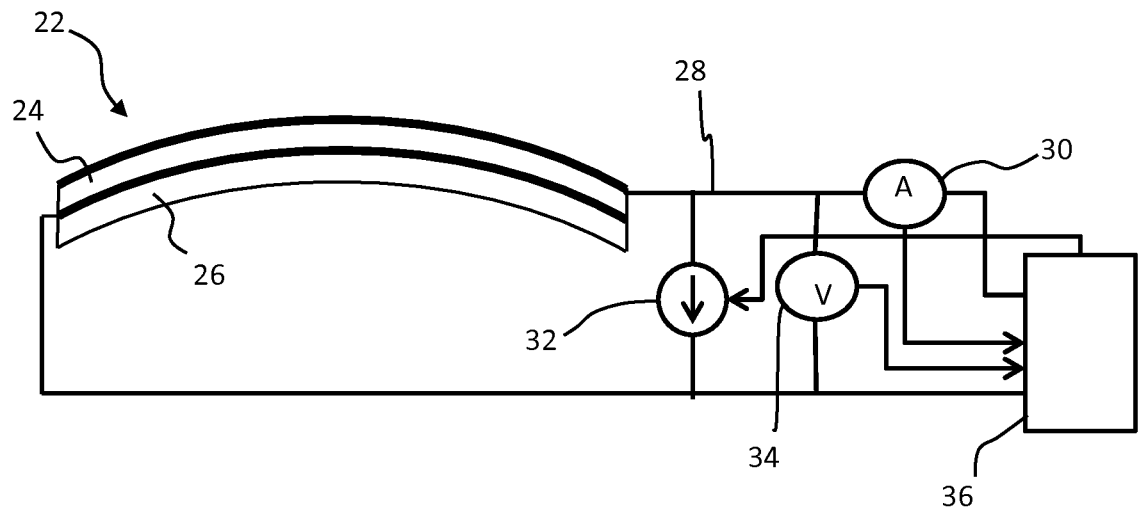
FIG. 3 shows an EAP actuator and sensor system.

FIG. 3 shows an EAP actuator 22, comprising an upper EAP material layer 24 sandwiched between two electrodes. The sandwich is disposed and attached on top of a lower carrier layer 26. The electrodes are electrically connected to a current sensor 30 for sensing a current flowing to the actuator, a current source 32 for controlling a current through the actuator (in particular a discharge current), optionally a voltage meter 34 for reading a voltage at the actuator, and a controller 36. The controller 36 provides an actuation signal to the electrode arrangement, which comprises an activation period for charging the actuator and a de-activation period for discharging the actuator.

The invention is based on determining the electrical characteristics of the actuator to provide a sensing function, in particular the complex impedance function.

Figure 4:
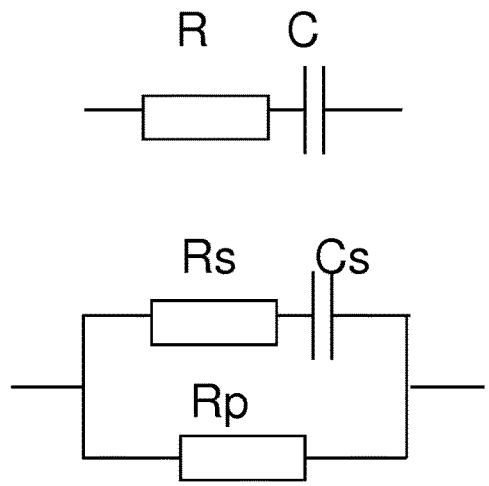
FIG. 4 shows the typical electrical equivalent circuit of a non-activated EAP

The typical electrical equivalent circuit of a non-activated EAP is shown in FIG. 4. The circuit is a series circuit of a first resistor ($R_s$) and a capacitor ($C_s$) in parallel with a second parallel resistor ($R_p$). In a simplified version, this equivalent circuit can be converted into a series circuit of a resistance (R) and a capacitance (C) as shown. By way of example, the circuit component values are $R_p$=10 MOhm, $R_s$=80 kOhm, $C_s$=800 nF.

The real (R) and the imaginary part ($X_C$=1/ωC) of the simplified equivalent circuit can be calculated by means of the voltage distribution as well as the phase shift between the voltages and the common current through both components. Thus, by current and voltage measurements, the resistance R and capacitance C can be obtained. However, this does not give all of the parameters of the full (3-component) equivalent circuit, so that additional measurements are required, as explained further below.

The circuit parameters will first be defined:

Complex impedance $$\underline{Z} = \text{Re}\{\underline{Z}\} + j \cdot \text{Im}\{\underline{Z}\} \qquad \text{Equation 1}$$

Resistance $$R = \text{Re}\{\underline{Z}\} \qquad \text{Equation 1}$$

Reactance $$X = \text{Im}\{\underline{Z}\} \qquad \text{Equation 2}$$

Reactance $$X_C = \frac{1}{2\pi \cdot f \cdot C} \qquad \text{Equation 3}$$

Phase angle $$\varphi = \tan^{-1}\left(\frac{\text{Im}\{\underline{Z}\}}{\text{Re}\{\underline{Z}\}}\right) \qquad \text{Equation 4}$$

According to the definitions above, the complex impedance is defined by its real (R) and imaginary part (X) as well as the phase displacement (φ) between both values. All three parameters can also be written as a function of the single values ($R_s$, $X_s$ and $R_p$) of the full equivalent circuit of FIG. 4.

The complex impedance of the full equivalent circuit is:

Complex impedance $$Z = \frac{(R_s + jX_{C_s}) \cdot R_p}{(R_s + jX_{C_s}) + R_p} \quad \text{Equation 5}$$

By separating Equation 6 into its real and imaginary parts:

Resistance $$R = \text{Re}\{Z\} = \frac{R_s R_p (R_s + R_p) + R_p X_s^2}{(R_s + R_p)^2 + X_s^2} = 79.403 \, k\Omega \quad \text{Equation 6}$$

Reactance $$X = \text{Im}\{Z\} = \frac{R_s X_p (R_s + R_p) - R_s R_p X_s}{(R_s + R_p)^2 + X_s^2}$$
$$= 19.579 \, k\Omega \quad \text{Equation 7}$$

The phase displacement is given to be:

Phase angle $$\varphi = \tan^{-1}\left(\frac{\text{Im}\{Z\}}{\text{Re}\{Z\}}\right) = 13.4° \, (\equiv 3.847 \, ms) \quad \text{Equation 8}$$

Finally, the magnitude of the complex impedance of the circuit can be calculated to be $|Z|=81.781 \, k\Omega$.

During an impedance measurement, a known voltage is generated to impress a current through the EAP component. Based on the measured current (often measured as a voltage drop across a series resistor) and the phase displacement between the current and voltage the impedance can be calculated.

It will now be shown how measurements applied to the circuit of FIG. 4 can be used to obtain all three component values, rather than only the simplified values of R and C.

For this evaluation a constant sinusoidal voltage is considered $|V_{osc}|=10$ V with an oscillation frequency of f=10 Hz. By means of the measurement the current $|I|$ and the phase displacement φ (the phase displacement between $|V_{component}$ and $|I|$) are defined. Both values are usually measured by adding a small resistance in series to the impedance to be measured.

All required values are then known to calculate the parameters of the simplified equivalent circuit:

Impedance $$|Z| = \frac{|V_{component}|}{|I|} \quad \text{Equation 9}$$

Resistance $$R = |Z| \cdot \cos(\varphi) \quad \text{Equation 10}$$

Reactance $$X = |Z| \cdot \sin(\varphi) \quad \text{Equation 11}$$

However, additional information is then needed to derive the component values for the full equivalent circuit. The conversion from the simplified equivalent circuit into the detailed circuit of FIG. 4 is usually performed by investigating the frequency behavior and numerical fitting approaches (in case no analytical solution exists) or by measuring the resistance (impedance) at a dc-voltage/current (which results in no current through the reactive part after the capacitance is fully charged).

A circuit simulation will now be used to show how the required additional information can be obtained using the method of the invention. The simulation firstly represents the standard impedance measurement technique realized by a voltage measurement across the EAP and a current measurement through the EAP and the extends these measurements with a further oscillatory current measurement.

Figure 5:
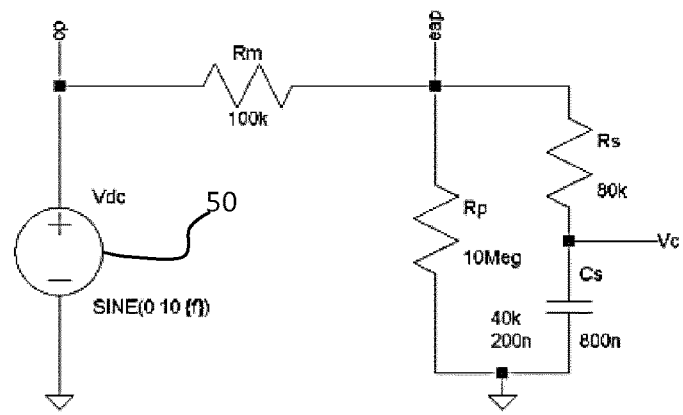
FIG. 5 shows an electrical scheme of an equivalent circuit of the EAP in modeling software.

FIG. 5 shows an electrical scheme based on equivalent circuit of the EAP in modeling software. The full equivalent circuit of the EAP actuator is driven by a voltage source 50 through a measurement resistor Rm.

Figure 6:
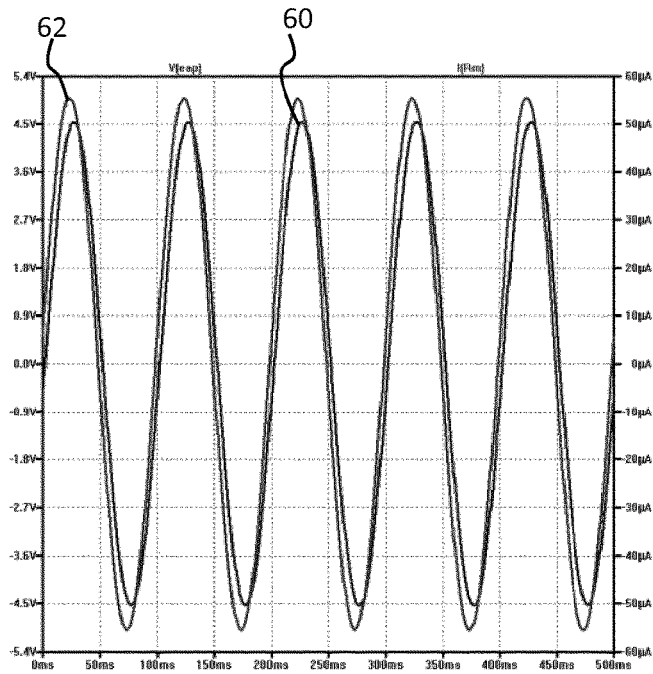
FIG. 6 shows simulation results showing the voltage across the EAP as well the current through it.

The EAP is operated by an AC voltage source 50 generating a sinusoidal voltage of $10V_{pp}$ at a frequency of 10 Hz as mentioned above. The corresponding simulation results showing the voltage across the EAP (plot 60) as well the current through it (plot 62), are shown in FIG. 6.

Figure 7:
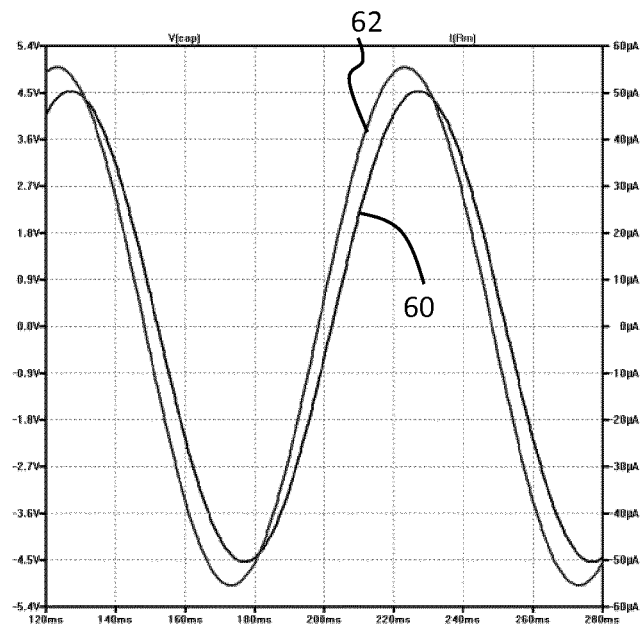
FIG. 7 shows a magnified view of part of the waveform of FIG. 6.

By implementing the calculations as outlined above, the magnitudes of this voltage and the current as well as their phase displacement can be determined. With these values the complex impedance is fully defined. A magnified view of part of the waveform is shown in FIG. 7.

The numerical values are:
Phase displacement φ=13.85°
Reactance X=19.581 kΩ
Resistance R=79.404 kΩ.

This shows that the waveform analysis is correctly able to determine the component values of the (simplified) equivalent circuit. The very small differences to the analytical results are based on numerical effects in the simulation. However, only the complex impedance for the simplified circuit is obtained, and to separate out the series resistance, parallel resistance and capacitance values from the overall complex impedance, further efforts need to be taken.

The invention provides an apparatus and method to determine the full equivalent circuit parameters to get the most comprehensive overview of the performance of an EAP.

It has been shown above that circuit simulation can be used to define the real and imaginary part as well the phase displacement of a complex impedance as also would be obtained in practice by measuring the voltage across, and the current through, an EAP actuator and sensor component.

Figure 8:
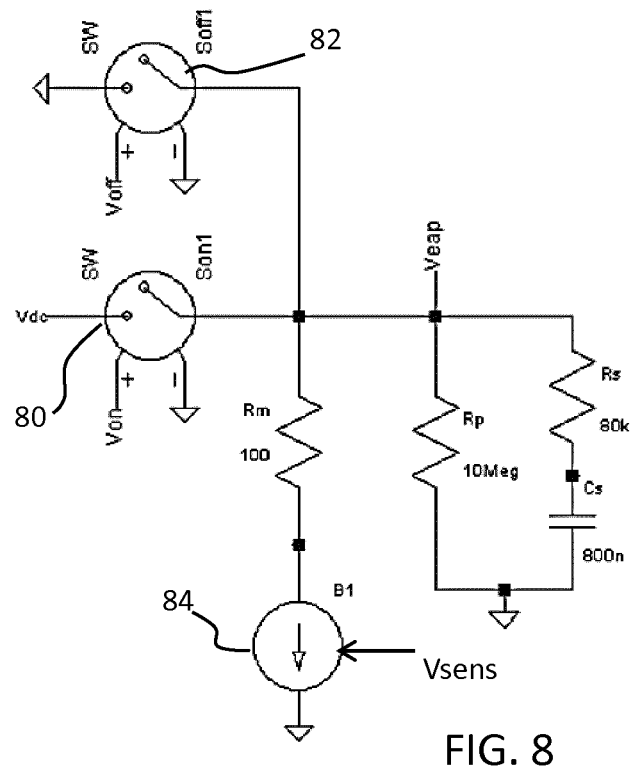
FIG. 8 shows a circuit simulation to provide the functionality of the circuit of FIG. 3.

FIG. 8 shows a circuit simulation for implementing the circuit (i.e. FIG. 3) and measurement approach of the invention.

The circuit comprises the equivalent circuit of EAP actuator connected to an ideal driver output terminal. The driver output terminal connects to an on switch 80 for coupling an operating DC voltage Vdc (e.g. 200V) to the terminal, and an off switch 82 for coupling ground to the terminal to turn off the EAP actuator. The constant DC driving voltage ($V_{dc}$) as well as the digital control for the switches ($V_{on}$, $V_{off}$) are modeled as ideal voltage sources.

A discharging branch consists of an (ideal) current sink 84 (or a corresponding variable resistance) and an optional discharging resistor $R_m$.

The discharging branch implements a sinusoidal discharge current waveform, implemented in the model by a digital signal ($V_{sens}$).

The whole circuit is controlled in such a way that after 0.5 seconds the EAP will be activated for 1.0 seconds. During a next time slot of 1.0 seconds the EAP is deactivated (discharged) via the discharging branch.

Figure 9:
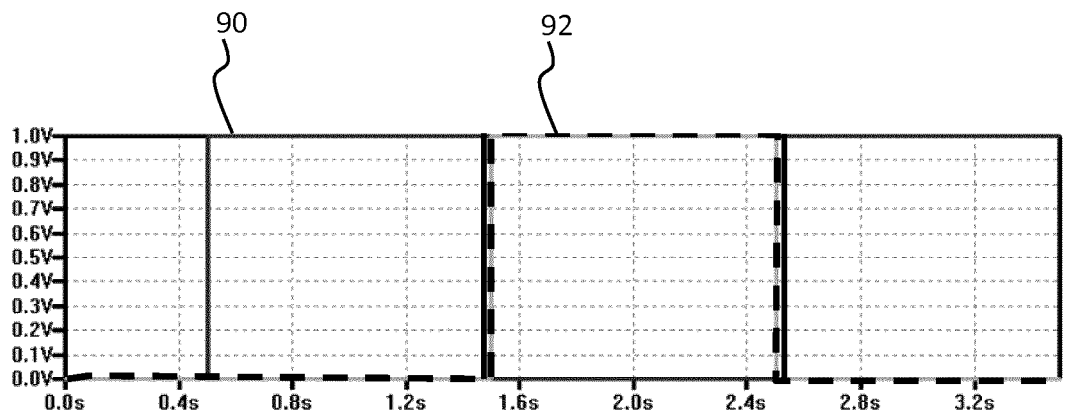
FIG. 9 shows timing of an actuation signal.

The timing is graphically shown in FIG. 9. Plot 90 shows the voltage applied to the terminal by the two switches 80, 82 and plot 92 shows the voltage Vsens used to control the current flowing in the discharge path. This voltage Vsens may simply be considered to be an activation signal, and as explained below it results in a particular current waveform being applied, such as an oscillating current waveform of a particular current and frequency.

In general, the proposed procedure to determine the full equivalent circuit parameters of the EAP actuator consists of three steps:

1. Calculate the parallel resistance $R_p$ while constantly actuating the EAP component. In particular, the resistance of the first resistor $R_p$ is derived by sensing a steady state current during the activation period.
2. Determine the series capacitance via charge calculations during the steady state operation. In particular, a capacitance of the capacitor is derived by determining a charge flow during charging of the actuator at the beginning of the activation period, and taking into account the resistance of the first resistor $R_p$.
3. Define the phase displacement of the series impedance while (quasi-) linearly charging or discharging the component. A linear charge or discharge has a constant current. Instead, an oscillating charge or discharge current is used, but with a constant magnitude, i.e. a constant AC current. In this way, a resistance of the second resistor R is derived by controlling a current through the actuator using the current source during charging or discharging to have an oscillating profile and determining a phase relationship between the sensed current and voltage.

The three steps are explained in further detail below.

The parallel resistance $R_p$ is obtained while constantly actuating the EAP. When the intrinsic capacitance $C_s$ of the EAP actuator is fully charged, a constant current flows only through the parallel branch, limited by the parallel resistor $R_p$. Accordingly, this resistance can be calculated by dividing the applied voltage by the actual current. The applied voltage is in any case known by the controller. Therefore, only the constant current needs to be defined by a measurement. This current can be easily measured when it is constant, which in the current example is after about 1 second, i.e. 0.5 s into the activation period.

Figure 10:
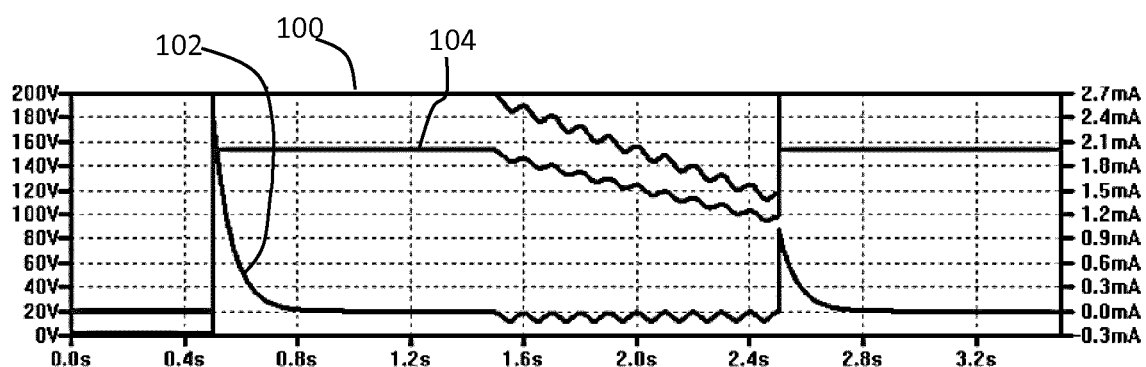
FIG. 10 shows the simulated voltage across the EAP and the current response.

FIG. 10 shows the simulated voltage across the EAP (plot 100) and the current response. The current flows in both parallel branches of the equivalent circuit, with the capacitor branch current (plot 102) decaying exponentially and the parallel resistor branch current (plot 104) which is constant during activation (between time 0.5 s and 1.5 s). Note that FIG. 10 shows the parallel resistor current multiplied by 10 to make it visible.

The constant current is 20 µA. Thus, the parallel resistance $R_p$ can be calculated to be 200V/20 µA=10MΩ.

Note that the parallel current flowing through the first resistor $R_p$ may be measured based on evaluating charge flow. This may be of interest because charge-related data is in any case used to determine the reactance $X_{C_s}$ as described below. The charge flow may of course be measured as the time-integral of the instantaneous current.

Of interest is the charge delivered to the EAP, which is defined by the time-integral of the current flowing through the component. Mathematically this is described according to Equation 12.

$$Q = \int_{t_1}^{t_2} i(t)dt \quad \text{Equation 12}$$

Figure 11:
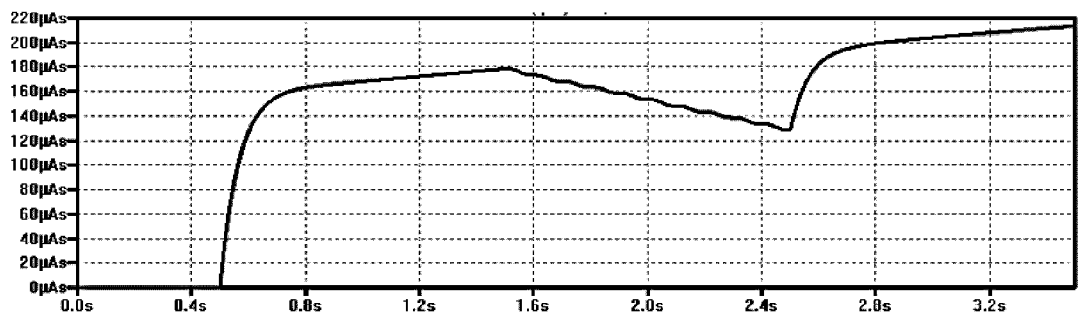
FIG. 11 shows the charge flow.

The charge flow is shown in FIG. 11. At t=1 s the charge is $Q_{tot}$=169 µAs. During the activation, charges are also flowing through the parallel resistance $R_p$. These charges can be subtracted from the total charge in order to determine the charges stored in the capacitance.

Charge flow through the parallel resistance $R_p$ can easily be calculated, because the parallel resistance has already been determined, in this example to be 10 MΩ.

The current after 0.5 s was 20 µA, accordingly the charge flow during this time is $Q_{R_p}$ 20 µA×0.5 s=10µAs. Therefore, the charge delivered to the capacitance is $Q_{C_s}$=169 µAs-10 µAs=159 µAs. Since a constant voltage is applied, the capacitance can be calculated according to Equation 14 (for a varying voltage, an integral definition needs to be considered):

$$\text{Charge } Q = C \cdot V \quad \text{Equation 13}$$

Thus, the capacitance can be calculated to be Cs=159 µAs/200V=795 nF. This is very close to the actual value of 800 nF. The difference of only 0.6% is based on the numerical simulation precision.

Based on the capacitance of 795 nF, the reactance $X_C$ at 10 Hz can be calculated according to Equation 4. This gives $X_C$ as 20.019 kΩ

The series and parallel resistances as well as the capacitance Cs may be predefined already after manufacturing both as a function of frequency and also under different load conditions. A look up table may for example be used to convert from measured values to the external force being sensed.

Finally, in order to obtain the series resistance $R_s$, the phase displacement of the series impedance is measured while linearly discharging or charging the component.

In a first example the discharge part of the cycle is used. The discharge branch is thus used for this purpose, and in particular the circuit behavior between the timestamps of 1.5 s and 2.5 s. The EAP actuator is discharged in a controlled manner during this time period, under the control of the signal Vsens.

Therefore, the discharge current sink is designed or controlled in such a way that a constant AC current of 100 µA is drawn from the EAP actuator.

Figure 12:
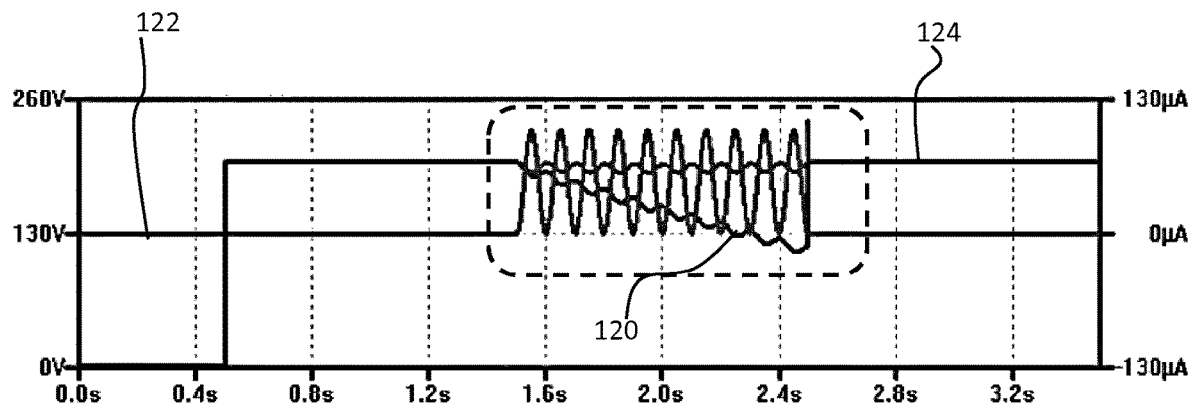
FIG. 12 shows the discharging behavior.

This discharging behavior is shown in FIG. 12. Plot 120 shows the voltage Veap across the actuator and plot 122 shows the discharge current, i.e. the current through the resistor Rm. Plot 124 is a further artificial compensation voltage explained below.

Figure 13:
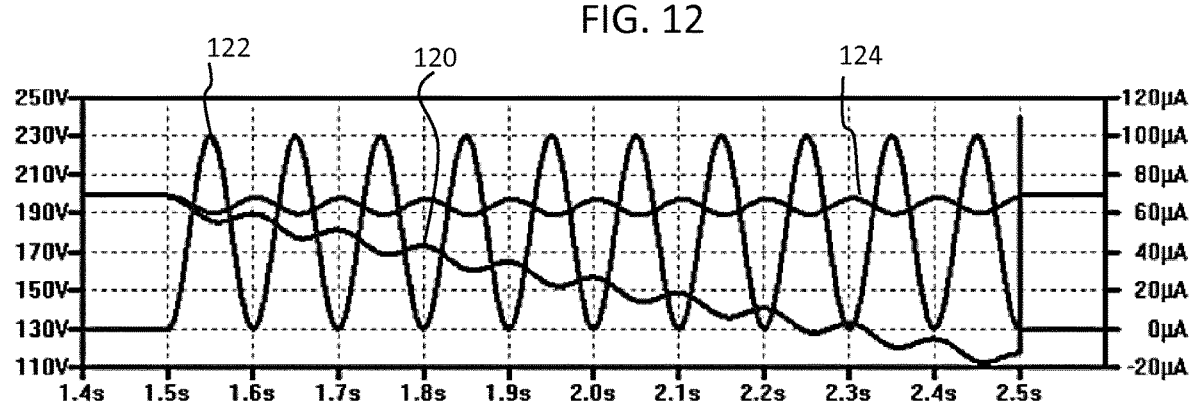
FIG. 13 shows a magnification of part of the waveform of FIG. 12.

FIG. 13 shows a magnification of the interesting time frame between 1.5 s and 2.5 s. For the further definition of the equivalent circuit parameters, the phase displacement between the voltage and the discharge current needs to be determined.

As can be seen in FIG. 13, the voltage 120 across the EAP is decreasing as a function of time. Therefore, the phase displacement between voltage and current will be distorted. However, due to the (almost) linear behavior of the voltage reduction (the time constant τ is very large) this decrease can be compensated by a simple mathematical equation of the type m·x+b, whereas b the maximum voltage of 200V is and m the (negative) slope of the voltage decrease, which is (119V−200V)/1 s=−81V/s. This yields the compensation voltage waveform 124.

The phase displacement between voltage and current can then be determined, and in this example this yields 13.98°.

The determination of the slope of the voltage decrease may be performed in the application itself, or already before, as part of a calibration procedure, just after manufacturing or just before implementation.

It can also be done on demand. For example, the slope may be calculated during the first half of the deactivation cycle (e.g. after 0.5 s) and the required phase displacement may then be calculated during the second half of the deactivation cycle.

The reactance and phase displacement are thus known, so that the series resistance can then also be calculated according to Equation 5. In this example, it gives $R_s$=80,411 kΩ.

Having derived the equivalent circuit parameters, a mapping may then be made between these parameters and an external signal to be sensed. The external signal may be a pressure or a force, or it may be a temperature.

During a calibration or characterization procedure (e.g. to provide information for the system datasheet), several actuation levels with different loads, forces, pressures and/or temperatures are applied to the EAP and the equivalent circuit parameters are identified by known methods such as using an impedance analyzer. The results either could be stored in look-up tables (and missing entries may be found by interpolation) or analytical fitting functions may be derived from the data. Of course, the more entries such a table has, the higher the precision.

The determination may be carried out at one fixed frequency, for which 10 Hz is just an example.

During the parameter variation of the calibration or characterization stage, the resonance frequency may also be derived and stored in the look-up table as well. During the application later, the actuation level is known and the equivalent circuit parameters at the specific (known) resonance frequency may then also be determined.

The change in electrical properties of the EAP sensor/actuator in response to an applied force are well known. With regard to temperature measurement, the applicant has proposed but not yet published the use of an EAP actuator with measurements of the electrical characteristics at at least first and second different frequencies. From the measurements a temperature at the electroactive material device and an external pressure or force applied to the electroactive material device may be obtained. This means a sensor can be used as a pressure sensor for load sensing e.g. skin contact pressure and as a temperature sensor. The approach is based on superposing a high frequency sensing signal over a low frequency or DC actuation signal. By providing sensing at two or more frequencies, the effect of temperature of the mechanical resonance frequency can be detected, and hence temperature can be determined.

This invention enables the impedance at different frequencies to be obtained by using different frequency oscillating current waveforms.

The parallel resistance Rp and series capacitance Cs are obtained during steady state behavior. The most important parameter is the series resistance Rs for which the frequency behavior is also determined. For a mechanical system, which is damped according to an externally applied force or pressure, this damping directly has an impact on the value of Rs. The impact on the parallel resistance Rp and on the series capacitance are of secondary order significance and they may thus be ignored.

There are various options for the way the oscillating current is controlled. In the example above, a defined and controlled oscillating current discharge of an EAP device is provided in order to determine the phase displacement between voltage and current and finally to calculate the complex impedance. The calculations may rely on previously obtained parameter either performed prior to the discharge period or as a result of a calibration.

The discharge measurement requires deactivation of the actuator. In general, there will be periods of deactivation, for example within a cyclic operation. If the required deactivation is longer than is desired by the actuation scheme, the method may result in unwanted behavior in the application. However, only a few oscillating cycles are required, and if a high frequency is chosen (e.g. 1 kHz, or even in the MHz regime—where the EAP mechanical response cannot follow), the deactivation phase can be very short, so that the oscillation will not be recognized in the application itself.

If EAP sensing capability is desired but without any deactivation, a high frequency signal as mentioned above may be implemented. Furthermore, the discharge may be reduced by adding a DC bias to the discharging oscillation. This contributes to maintain the actuation state as much as possible.

As discussed above, the resonant behavior of the EAP device is meaningful to determine pressure, force or temperature. However, in order to detect the resonance- or anti resonance frequency, the complex impedance as a function of the frequency needs to be determined. Accordingly, the proposed procedure may be extended by using a frequency sweep during the deactivation phase. Approximate resonance and anti-resonance frequencies may be defined prior to the application based on the dimensions of the device or by calibration measurements under different load conditions, as explained above.

In a different set of examples, the oscillating current may be provided as part of the activation cycle. In this case, there may be a three-stage charging cycle. The parallel resistance may be obtained from the steady state behavior as explained above. The capacitance may be obtained from the charging behavior, during a voltage controlled part of the charging process, also as described above. However, the series resistance may then be calculated from a current-controlled part of the charging cycle. The EAP actuator may be driven to a voltage below the final voltage for the first two measurements, and then a final actuation driving takes place with current control to determine the series resistance.

Figure 14:
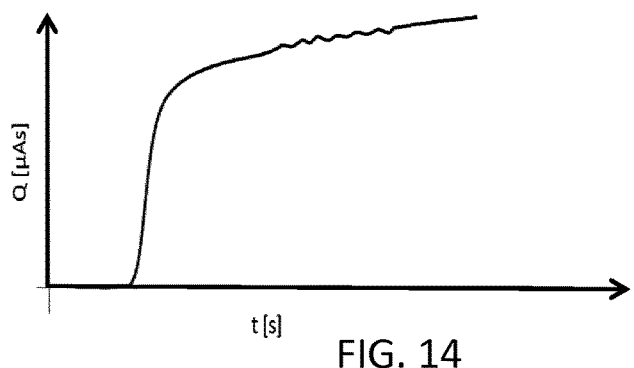
FIG. 14 shows the charge level on EAP actuator in an alternative measurement approach.

FIG. 14 shows the charge level on EAP actuator in such an approach.

Another alternative approach is to provide a continuous low frequency charging or discharging constant current. This may be used during a quasi-static actuation time of the of the EAP actuator. This provides a mixed approach, without modulating the driving signal, but also making steady state measurements in between from time to time, for example after a certain waiting period or, if any change has been identified.

Figure 15:
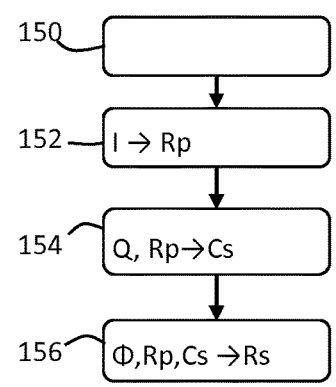
FIG. 15 shows a sensing and actuation method.

FIG. 15 shows a method for simultaneous actuation and sensing using an electroactive material actuator and sensor component, The component has an equivalent electrical circuit of a first resistor Rp in parallel with the series combination of a capacitor Cs and a second resistor Rs. The method comprises:

In step 150 an actuation signal is provided to the electrode arrangement, which comprises an activation period for charging the component, In step 152 a resistance of the first resistor Rp is determined by sensing a steady state current (I) during the activation period;

In step 154 a capacitance of the capacitor Cs is obtained by determining a charge flow (Q) during charging of the component at the beginning of the activation period, and taking into account the resistance of the first resistor Rp;

In step 156 a resistance of the second resistor Rs is determined by controlling a current through the component using the current source during charging or discharging to have an oscillating profile and determining a phase relationship ($\varphi$) between a sensed current and a sensed voltage.

Although in the detailed description herein above the construction and operation of devices and systems according to the invention have been described for EAPs, the invention can in fact be used for devices based on other kinds of EAM material. Hence, unless indicated otherwise, the EAP materials hereinabove can be replaced with other EAM materials. Such other EAM materials are known in the art and the person skilled in the art will know where to find them and how to apply them. A number of options will be described herein below.

A common sub-division of EAM devices is into field-driven and current or charge (ion) driven EAMs. Field-driven EAMs are actuated by an electric field through direct electromechanical coupling, while the actuation mechanism for current or charge driven EAMs involves the diffusion of ions. The latter mechanism is more often found in the corresponding organic EAMs such as EAPs. While Field driven EAMs generally are driven with voltage signals and require corresponding voltage drivers/controllers, current driven EAMs generally are driven with current or charge signals sometimes requiring current drivers. Both classes of materials have multiple family members, each having their own advantages and disadvantages.

Field driven EAMs, can be organic or inorganic materials and if organic can be single molecule, oligomeric or polymeric. For the current invention they are preferably organic and then also oligomeric or even polymeric. The organic materials and especially polymers are an emerging class of materials of growing interest as they combine the actuation properties with material properties such as light weight, cheap manufacture and easy processing.

The field driven EAMs and thus also EAPs are generally piezoelectric and possibly ferroelectric and thus comprise a spontaneous permanent polarization (dipole moment), are electrostrictive and thus comprise only a polarization (dipole moment) when driven, but not when not driven or are dielectric relaxor materials. Such polymers include, but are not limited to, the sub-classes: piezoelectric polymers, ferroelectric polymers, electrostrictive polymers, relaxor ferroelectric polymers, dielectric elastomers, liquid crystal elastomers.

The lack of a spontaneous polarization means that electrostrictors display little or no hysteretic loss even at very high frequencies of operation. The advantages are however gained at the expense of temperature stability. Relaxors operate best in situations where the temperature can be stabilized to within approximately 10° C. This may seem extremely limiting at first glance, but given that electrostrictors excel at high frequencies and very low driving fields, then the applications tend to be in specialized micro actuators. Temperature stabilization of such small devices is relatively simple and often presents only a minor problem in the overall design and development process.

Preferably the EAM or EAP material is an electrostrictive polymer. More preferably it is a relaxor ferroelectric material. Such materials can have an electrostrictive constant that is high enough for good practical use, i.e. advantageous for simultaneous sensing and actuation functions. Relaxor ferroelectric materials are non-ferroelectric when zero driving field (i.e. voltage) is applied to them, but become ferroelectric during driving. Hence there is no electromechanical coupling present in the material at non-driving. The electromechanical coupling becomes non-zero when a drive signal is applied and can be measured through applying the small amplitude high frequency signal on top of the drive signal, in accordance with the procedures described above. Relaxor ferroelectric materials, moreover, benefit from a unique combination of high electromechanical coupling at non-zero drive signal and good actuation characteristics.

The most commonly used examples of inorganic relaxor ferroelectric materials are: lead magnesium niobate (PMN), lead magnesium niobate-lead titanate (PMN-PT) and lead lanthanum zirconate titanate (PLZT). But other are known in the art.

Examples of field-driven EAPs are piezoelectric polymers, ferroelectric polymers, electrostrictive polymers (such as PVDF based relaxor polymers or polyurethanes), dielectric elastomers and liquid crystal elastomers (LCE). Thus, preferably the EAP material is a relaxor ferroelectric polymer such as e.g. PVDF based relaxor ferroelectric based polymer. Such materials can be any one chosen from the group of materials herein below The sub-class electrostrictive polymers includes, but is not limited to:

Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluorid-trifluoroethylene-chlorotrifluoroethylene) (PVDF-TrFE-CTFE), Polyvinylidene fluoride-hexafluoropropylene (PVDF-HFP), polyurethanes or blends thereof.

The current driven EAMs and EAPs comprise conjugated polymers, Ionic Polymer Metal Composites, ionic gels and polymer gels.

Examples of ionic-driven EAPs are conjugated polymers, carbon nanotube (CNT) polymer composites and Ionic Polymer Metal Composites (IPMC).

The sub-class dielectric elastomers includes, but is not limited to:

acrylates, polyurethanes, silicones.

The sub-class conjugated polymers includes, but is not limited to:

polypyrrole, poly-3,4-ethylenedioxythiophene, poly(p-phenylene sulfide), polyanilines.

The materials above can be implanted as pure materials or as materials suspended in matrix materials. Matrix materials can comprise polymers.

To any actuation structure comprising EAM material, additional passive layers may be provided for influencing the behavior of the EAM layer in response to an applied drive signal.

The actuation arrangement or structure of an EAP device can have one or more electrodes for providing the control signal or drive signal to at least a part of the electroactive material. Preferably the arrangement comprises two electrodes. The EAP may be sandwiched between two or more electrodes. This sandwiching is needed for an actuator arrangement that comprises an elastomeric dielectric material, as its actuation is among others due to compressive force exerted by the electrodes attracting each other due to a drive signal. The two or more electrodes can be also be embedded in the elastomeric dielectric material. Electrodes can be patterned or not.

A substrate can be part of the actuation arrangement. It can be attached to the ensemble of EAP and electrodes between the electrodes or to one of the electrodes on the outside.

The electrodes may be stretchable so that they follow the deformation of the EAM material layer. This is especially advantageous for EAP materials. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

The materials for the different layers will be selected for example taking account of the elastic moduli (Young's moduli) of the different layers.

Additional layers to those discussed above may be used to adapt the electrical or mechanical behavior of the device, such as additional polymer layers.

The device may be used as a single actuator, or else there may be a line or array of the devices, for example to provide control of a 2D or 3D contour.

The invention can be applied in many EAP applications, including examples where a passive matrix array of actuators is of interest.

In many applications the main function of the product relies on the (local) manipulation of human tissue, or the actuation of tissue contacting interfaces. In such applications EAP actuators provide unique benefits mainly because of the small form factor, the flexibility and the high energy density. Hence EAPs can be easily integrated in soft, 3D-shaped and/or miniature products and interfaces. Examples of such applications are:

Skin cosmetic treatments such as skin actuation devices in the form of EAP-based skin patches which apply a constant or cyclic stretch to the skin in order to tension the skin or to reduce wrinkles;

Respiratory devices with a patient interface mask which has an EAP-based active cushion or seal, to provide an alternating normal pressure to the skin which reduces or prevents facial red marks;

Electric shavers with an adaptive shaving head. The height of the skin contacting surfaces can be adjusted using EAP actuators in order to influence the balance between closeness and irritation;

Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of EAP transducers which is integrated in or near the user interface;

Catheters with a steerable tip to enable easy navigation in tortuous blood vessels.

Another category of relevant application which benefits from EAP actuators relates to the modification of light. Optical elements such as lenses, reflective surfaces, gratings etc. can be made adaptive by shape or position adaptation using EAP actuators. Here the benefits of EAPs are for example the lower power consumption.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claime is:

1. A device for simultaneous actuation and sensing comprising:
   an electroactive material actuator/sensor,
      wherein the electroactive material actuator/sensor has an equivalent electrical circuit, and wherein the equivalent electrical circuit is a first resistor in parallel with a series combination of a capacitor and a second resistor;
   an electrode arrangement;
   a current sensor, wherein the current sensor is arranged to sense a current flowing to the electroactive material actuator/sensor;
   a current source, wherein the current source is arranged to control a current through the electroactive material actuator/sensor;
   a voltage sensor, wherein the voltage sensor is arranged to measure a a voltage across the electroactive material actuator/sensor; and
   a controller circuit,
      wherein the controller circuit is arranged to provide an actuation signal to the electrode arrangement,
      wherein the actuation signal comprises an activation period for charging the electroactive material actuator/sensor,
      wherein the controller circuit is further arranged to determine a resistance of the first resistor by sensing a steady state current during the activation period,
      wherein the controller circuit is further arranged to determine a capacitance of the capacitor by determining a charge flow during the charging of the electroactive material actuator/sensor at the beginning of the activation period, and
      wherein the controller circuit is further arranged to determine a resistance of the second resistor by controlling the current through the electroactive material actuator/sensor using the current source during the charging or discharging of the electroactive material actuator/sensor to have an oscillating profile and determining a phase relationship between the current sensed by the current sensor and the voltage measured by the voltage sensor.

2. The device as claimed in claim 1, wherein the actuation signal has the activation period of at least 0. 5 seconds.

3. The device as claimed in claim 1, wherein the oscillating profile has a frequency of at least 100 Hz.

4. The device as claimed in claim 1, wherein the oscillating profile has a DC bias.

5. The device as claimed in claim 1, wherein the oscillating profile has a frequency which varies over time.

6. The device as claimed in claim 1, wherein the controller circuit is further arranged to provide a de-activation period for the discharging of the electroactive material actuator/sensor, and to determine the resistance of the second resistor during the discharging of the electroactive material actuator/sensor.

7. The device as claimed in claim 1, wherein the controller circuit is arranged to determine the resistance of the second resistor during the charging of the electroactive material actuator/sensor.

8. The device as claimed in claim 1, wherein the controller circuit is further arranged to determine, from the determined resistances and capacitance, an external force, pressure, or temperature at the electroactive material actuator/sensor.

9. The device as claimed in claim 1, wherein the oscillating profile has a frequency of at least 1 kHz.

10. A method for simultaneous actuation and sensing using an electroactive material actuator/sensor, wherein the electroactive material actuator/sensor has an equivalent electrical circuit, wherein the equivalent electrical circuit is a first resistor in parallel with a series combination of a capacitor and a second resistor, the method comprising:
    providing an actuation signal to an electrode arrangement, wherein the actuation signal comprises an activation period for charging the electroactive material actuator/sensor;
    determining a resistance of the first resistor by sensing a steady state current during the activation period;
    determining a capacitance of the capacitor by determining a charge flow during the charging of the electroactive material actuator/sensor at the beginning of the activation period; and
    determining a resistance of the second resistor by controlling a current through the electroactive material actuator/sensor during the charging or discharging of the electroactive material actuator/sensor to have an oscillating profile and determining a phase relationship between a sensed current and a measured voltage.

11. The method as claimed in claim 10, wherein the oscillating profile has a frequency of at least 100 Hz.

12. The method as claimed in claim 10, wherein the oscillating profile has a DC bias.

13. The method as claimed in claim 10, wherein the oscillating profile has a frequency which varies over time.

14. The method as claimed in claim 10, further comprising providing a de-activation period for the discharging of the electroactive material actuator/sensor, and determining the resistance of the second resistor during the discharging of the electroactive material actuator/sensor.

15. The method as claimed in claim 10, further comprising determining the resistance of the second resistor during the charging of the electroactive material actuator/sensor.

16. The method as claimed in claim 10, further comprising determining, from the determined resistances and capacitance, an external force, pressure, or temperature at the electroactive material actuator/sensor.

17. The method as claimed in claim 10, wherein the oscillating profile has a frequency of at least 1 kHz.

* * * * *